US006653850B2

(12) United States Patent
Pavelka

(10) Patent No.: US 6,653,850 B2
(45) Date of Patent: Nov. 25, 2003

(54) SURFACE PASSIVATION METHOD AND ARRANGEMENT FOR MEASURING THE LIFETIME OF MINORITY CARRIERS IN SEMICONDUCTORS

(75) Inventor: Tibor Pavelka, Budapest (HU)

(73) Assignee: Semilab Felvezto Fizikai Laboratorium RT, Budapest (HU)

( * ) Notice: Subject to any disclaimer, the term of this patent is extended or adjusted under 35 U.S.C. 154(b) by 29 days.

(21) Appl. No.: 09/958,172

(22) PCT Filed: Feb. 15, 2001

(86) PCT No.: PCT/HU01/00018

§ 371 (c)(1),
(2), (4) Date: Oct. 5, 2001

(87) PCT Pub. No.: WO01/61745

PCT Pub. Date: Aug. 23, 2001

(65) Prior Publication Data

US 2002/0158642 A1 Oct. 31, 2002

(30) Foreign Application Priority Data

Feb. 17, 2000 (HU) .............................................. 0000710

(51) Int. Cl.[7] ............................................ G01R 31/302
(52) U.S. Cl. ........................ 324/752; 324/719; 324/765
(58) Field of Search ................................ 324/765, 642, 324/752, 158.1, 780, 751, 766, 767, 719, 757, 758, 760; 365/106, 127; 438/17, 305

(56) References Cited

U.S. PATENT DOCUMENTS

| | | | |
|---|---|---|---|
| 5,406,214 A | 4/1995 | Boda et al. | |
| 5,580,828 A | 12/1996 | Ferenczi et al. | |
| 5,581,499 A | * 12/1996 | Hamamdjian | ................ 365/106 |
| 5,760,597 A | 6/1998 | Yoshida et al. | |
| 6,011,404 A | 1/2000 | Ma et al. | |
| 6,207,468 B1 | * 3/2001 | Chacon | ........................ 438/17 |

FOREIGN PATENT DOCUMENTS

| EP | 0 470 692 | 2/1992 |
|---|---|---|
| WO | 92/11528 | 7/1992 |

OTHER PUBLICATIONS

Schmidt et al "Easy–to–use Surface Passivation Technique for Bulk Carrier Lifetime Measurements on Silicon Wafers", Progress in Photovoltaics: Research & Applications Prog. Photovolt.Res.Appl. 6,259–263 (1998) XP002177527.

Schöfthaler et al "Sensitivity and transient response of microwave reflection measurements", J.Appl. Phys. 77 (7), Apr. 1, 1995, pp, 3162–3173. XP–002177528.

Schroder et al "Corona–Oxide–Semiconductor Device Characterization", Solid–State Electronics, vol. 42, No. 4, 1998 pp, 505–512. XP–002177529.

Schöfthaler et al, "High–Quality Surface Passivation by Corona–Charged Oxides for Semiconductor Surface characterization", IEEE, 1994, pp. 1509–1512. XP–002177526.

* cited by examiner

Primary Examiner—Kamand Cuneo
Assistant Examiner—Trung Nguyen
(74) Attorney, Agent, or Firm—Venable LLP; Robert Kinberg; Gabor J. Keleman

(57) ABSTRACT

The invention relates to a method and arrangement for passivating the surface of semiconductor samples in which, simultaneously to passivation, the life-time of free carriers is also determined by illuminating the semiconductor sample by a light pulse of higher energy than the forbidden band of the material, and the time function of the resistance change occurring in the semiconductor as a result of illumination is measured advantageously by a microwave reflectometer, and the life-time of carriers is determined as the characteristic time constant of the process. The essence of the method lies in that, the surface part of the semiconductor sample to be measured is continuously electrically charged. The arrangement comprises a microwave reflectometer (2), a signal processing unit (3), and a laser light source (4) illuminating the semiconductor sample (1). The surface of the semiconductor sample (1) charged by ions generated by corona generators (5, 6) simultaneously with the measurement.

8 Claims, 3 Drawing Sheets

Figure 1:
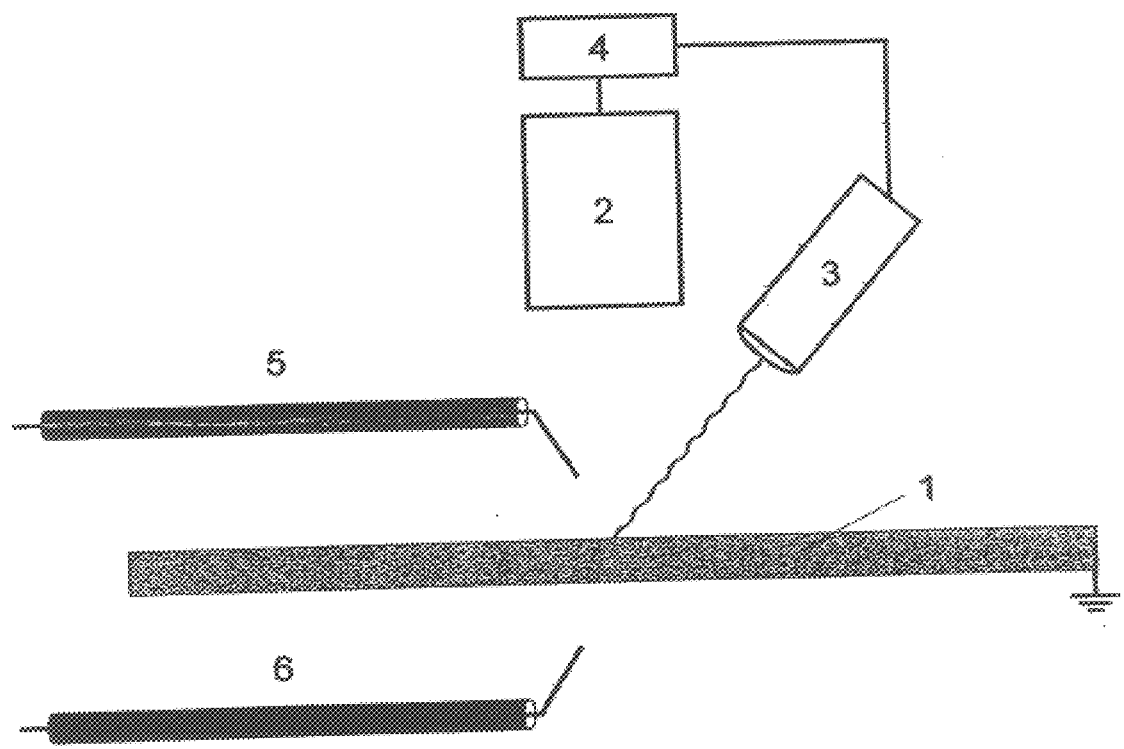

SURFACE PASSIVATION METHOD AND ARRANGEMENT FOR MEASURING THE LIFETIME OF MINORITY CARRIERS IN SEMICONDUCTORS

FIELD OF THE INVENTION

The invention relates to measuring the lifetime of minority carriers in semiconductors by microwave or eddy current so that the surface of the semiconductor sample is passivated simultaneously. Passivation is performed by continuously charging the semiconductor surface realised advantageously by corona discharge.

PRIOR ART

The lifetime of minority carriers is a very important parameter for characterising the purity of semiconductor materials and devices. One of the basic methods for determining the lifetime of carriers is the measurement of microwave reflection of the material. However, the objective of the measurement is to determine the bulk properties of the material, thus surface processes should be eliminated from the measurement, i.e. the surface should be passivated. At the same time, permanent changes in the sample should be avoided.

The invention relates to measuring the lifetime of minority carriers in semiconductors by microwave or eddy current so that the surface of the semiconductor sample is passivated simultaneously. Passivation is performed by continuously charging the semiconductor surface realised advantageously by corona discharge.

The lifetime of a minority carrier is an important parameter for characterising the purity of semiconductor materials and devices, since it is very sensitive against even to small quantities of impurities. Faults, dislocations or impurities present even below concentrations of $10^{10}/cm^3$ can already be detected by measuring the lifetime of minority carriers. These measuring techniques became fundamental tools in developing semiconductor technology and devices.

Several procedures are known for studying the recombination lifetime of minority carriers. One of the methods is based on microwave reflection. The present invention focuses on the elimination of only one of the basic problems of the microwave method, thus we restrict our discussion to describing this method.

First A. P. Ramsa, H. Jacobs and F. A. Brand described a procedure in the J. Appl. Phys., No.30 in 1995 concerning the determination of the recombination life-time of minority carriers from the decay of optically excited excess charge carriers so that the semiconductor was placed into a microwave field, and the time course of microwave reflection was measured.

In the excitation period of the measurement, excess charge carriers, i.e. electron-hole pairs are generated in a semiconductor by light pulses. After the light pulse, the original equilibrium state is restored in the semiconductor, the concentration of excess carriers gradually decreases; electrons and holes recombine with each other. The presence of impurity atoms or crystal faults accelerates the recombination. In the simple case, the time function of the recombination is exponential, with the so-called recombination lifetime as its time constant. The inverse of lifetime is a probability quantity which, in the presence of only one type of faults, is proportional to fault concentration. Microwave reflection methods are suitable for following the course of recombination processes in time. The sample is placed into a microwave field in a suitable arrangement, the frequency of the microwave source (e.g. Gunn oscillator) is typically 10 GHz. Usually a circulator is also coupled to the microwave source for transferring the microwave energy to an antenna. The antenna radiates the microwave onto the sample. In this reflection arrangement, the microwave reflected from the sample reaches a detector via circulator and antenna. The intensity of microwave reflected from the semiconductor sample depends, among other factors, on the conductivity of the semiconductor segment, thus on the momentary carrier concentration in the material.

If the carrier concentration changes in time, this is also reflected in a change of reflected microwave intensity. In case of small excitations, i.e. if excess carriers are present only in small amounts relative to the original equilibrium concentration, the intensity of reflected microwave signals is proportional to the change in conductivity i.e. in carrier concentration. Due to this, the time course of the microwave intensity sensed by the detector accurately reflects the change in minority carrier concentration. Thus the lifetime of minority carriers can be determined on the basis of reflected microwave intensity.

Several commercial devices protected by patent law have been constructed according to the above principle. Examples are the following USA patents: U.S. Pat. No. 4,704,576; U.S. Pat. No. 5,406,214.

However, in the course of the above measurements, a very important problem emerges. Whereas our aim is to measure phenomena taking place in the bulk of the semiconductor material, and through this, to determine the quality of the material, in measurement results processes occurring on the surface of the sample also appear, very often they even can play a dominant role. The reason for this is that on the surface of the semiconductor crystal, in addition to the bonds creating the crystal, so-called "hanging" bonds are also present forming recombination centres and thus accelerating the recombination of carriers. In order to eliminate the interfering surface recombination, the sample is either thermally oxidised or chemically passivated. These methods eliminate the surface recombination centres by doing away with the "hanging" bonds. However, these methods have also their significant drawbacks.

Thermal oxidation takes place at very high temperatures (about at 1000° C.). Parallel to growing the oxide layer, the semiconductor suffers other changes as well. Heat treatment transforms the dislocation or fault structures in the semiconductor, and let impurities present on the surface diffuse into its bulk. As a result, we cannot study the sample in its original state.

Another disadvantage of oxidation is that the oxide-semiconductor transition is, in general, not complete, thus "hanging" bonds are still present. These, acting as recombination centres, may further influence the results of carrier lifetime measurements. This drawback can be eliminated by a further step, by the so-called corona charging of the surface before measurement (Schöftaler). The method takes place by means of a corona generator which ionises the molecules in air and the ions are led to the oxide surface. In the oxide thus charged, a very high field strength partly penetrating into the semiconductor is generated. This electric field separates the carriers generated during measuring the carrier lifetime. This means that depending on polarity, the one type of carriers (e.g. negative electrons) are repulsed from the neighbourhood of the oxide-semiconductor transition, while carriers of opposite charge (e.g. positive holes) are attracted to the transition. Due to this, only one type of carriers is present at the transition. The requirement for recombination is, at the same time, the simultaneous presence of both types of carriers in a given part of the field. Due to corana charging of the oxide surface, no recombination occurs on the surface of the semiconductor (at semiconductor-oxide transitions), not even if some residual recombination centres are present.

Corona charging proved to be a very useful procedure in measuring thermally oxidised semiconductors. However, on oxide-free surfaces of semiconductors, due to the much greater conductivity, the ions from air are neutralised, thus no electric field and consequently, no passivation occurs. It is true even if instead of the highly isolating thermal oxide, another oxide-type with looser structure is grown on the semiconductor surface. The very thin, so-called "native" oxide grown spontaneously on the surface of several semiconductors (e.g. silicon) at ambient conditions is neither suitable for permanent charging. The reason for this is that such a layer is capable of keeping the charge only for seconds or minutes, thus the surface of the pretreated sample is neutralised even before starting the measurement.

The other procedure used is the so-called chemical surface passivation, which has the significant advantage as compared to oxidation that it takes place at ambient temperature, thus it does not change the properties of the bulk semiconducting material. Chemical passivation methods applied in practice (patent), however, change significantly the chemical structure of the surface. One of the disadvantages is that such samples contaminated on their surface cannot be further processed owing to the very strict purity requirements in semiconductor fabrication. Another problem is that chemically treated surfaces suffer transformations making sufficiently accurate reproduction of measurements impossible. Due to the above, lifetime measurements of carriers performed by chemical passivation cannot be regarded non-destructive.

As it is obvious from the earlier, a surface passivation method eliminating efficiently surface phenomena during measurements and, at the same time, preserving the bulk and surface properties of the semiconducting material seems to be very advantageous. As a result of being able to develop such a method, measurements could be repeated and checked, and the sample would remain suitable for further processing in semiconductor manufacturing.

SUMMARY OF THE INVENTION

The invention relates to measuring the lifetime of minority carriers in semiconductors by microwave or eddy current so that the surface of the semiconductor sample is passivated simultaneously. Passivation is performed by continuously charging the semiconductor surface realised advantageously by corona discharge.

The present invention relates to a method and arrangement for making lifetime measurements of minority carriers possible by surface passivation satisfying the above requirements.

The invention relates to a method for passivating the surface of semiconductor samples in which, simultaneously to passivation, the life-time of free carriers is also determined so that the semiconductor sample is illuminated by a light pulse of higher energy than the forbidden band of the material, and the time function of the resistance change occurring in the semiconductor as a result of illumination is measured advantageously by a microwave reflectometer, and the life-time of carriers is determined as the characteristic time constant of the process.

The essence of the method lies in that the surface part of the semiconductor sample to be measured is continuously charged.

The electric charging of the surface can be performed with ions from air or other gas ions generated by corona discharging, or the electric charging of the surface can be performed by illumination with UV light.

The semiconductor sample can be placed on a movable table and the measurement can performed as a function of place in any variation of the method.

The invention relates further to an arrangement for carrying out the method, which arrangement comprises a microwave reflectometer, in connection with microwave reflectometer, a controlling, recording and signal processing unit, which is connected to a laser light source so that semiconductor sample is illuminated with a light pulse of the laser having a higher energy than the forbidden band of the semiconductor material, and the time function of the resistance change occurring as a result of illumination is measured by microwave reflectometer and controlling, recording and signal processing unit, then the life-time of carriers is determined as the characteristic time constant of the process.

The essence of the arrangement lies in that, the surface of the semiconductor sample to be measured is continuously charged by ions from air or other gas ions generated by corona generators simultaneously with the measurement. In the arrangement charging of the surface on semiconductor sample to be measured can performed by UV light, instead of corana generators.

Summing up the essence of the invention consists in a continuous charging of a suitable part of the sample surface during the life-time measurement of minority carriers so that ions originating from air (gas) are continuously led to the surface of the sample. Field strength generated by charging separates the carriers in the proximity of the surface, thus surface recombination is reduced significantly or eliminated completely. The charging takes place continuously and simultaneously with the measurement, thus passivation is effective even if the surface or the layer covering the surface is not completely isolating. In practice, this means that the most typical materials, i.e. samples covered with "native" oxide become also measurable.

The arrangement for performing the method comprising a device for measuring microwave reflection for determining minority carriers and a unit making the continuous charging of the surface during measurement possible.

DETAILED DESCRIPTION OF THE INVENTION

Figure 2A:
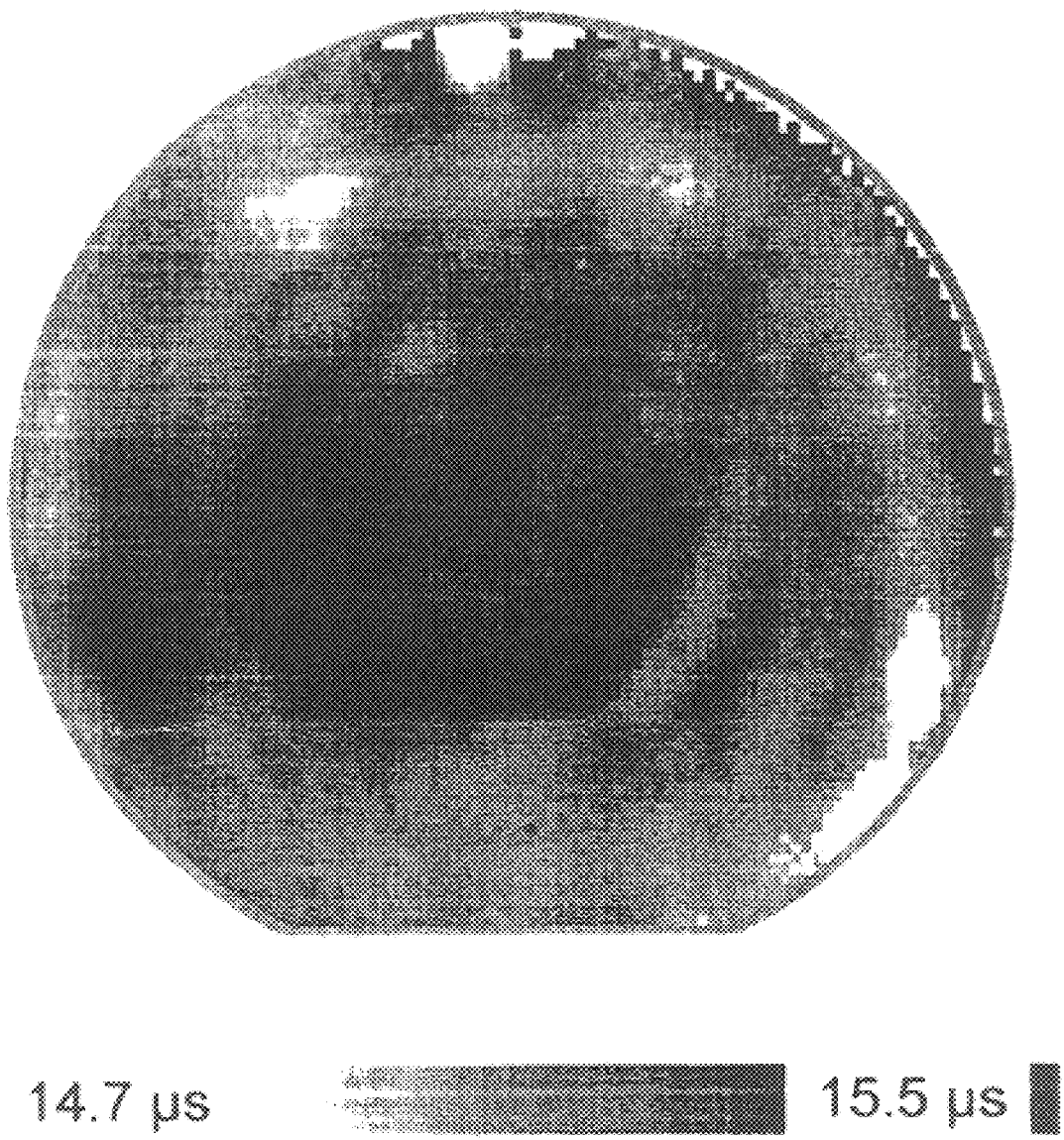
Figure 2B:
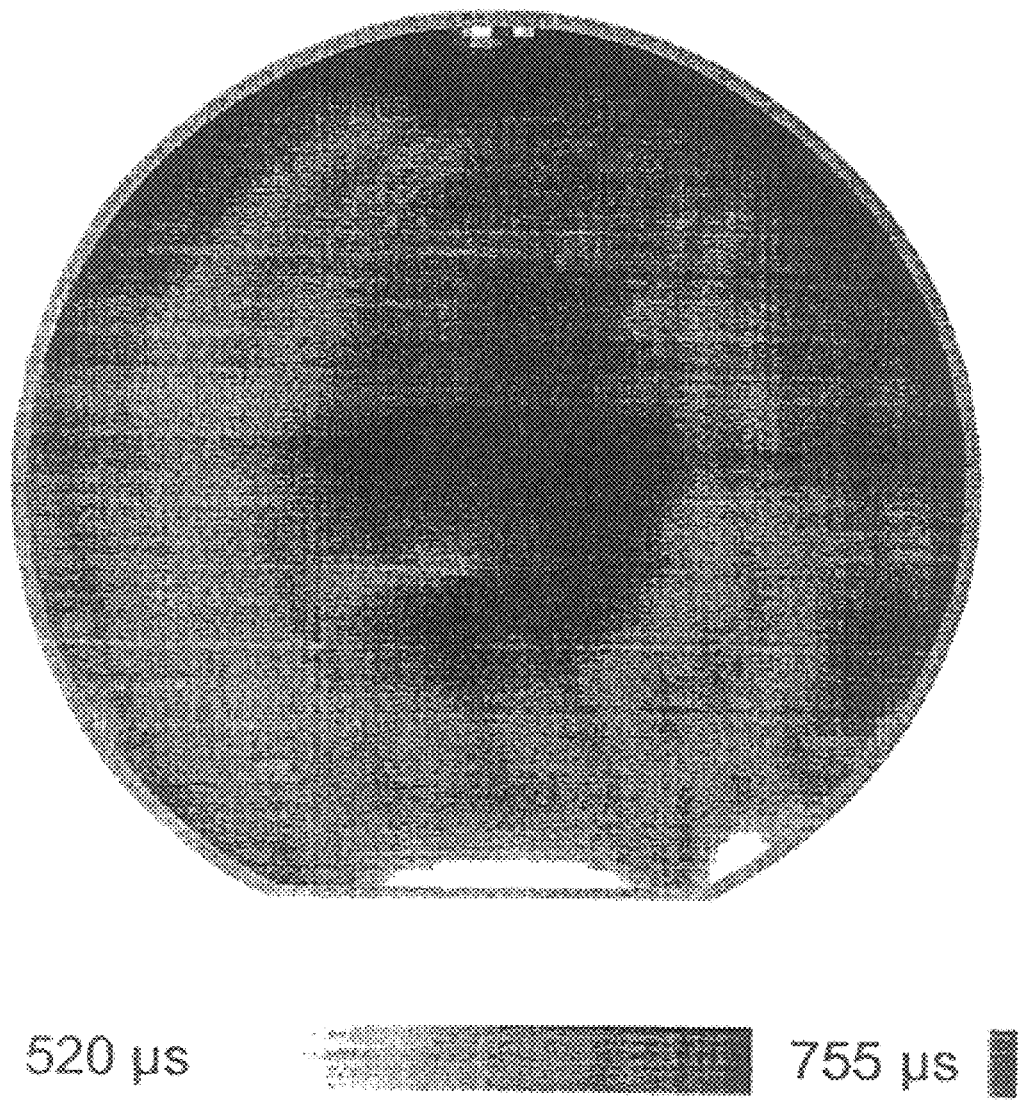

FIG. 1 shows an arrangement for microwave-based measuring of minority carriers, in which arrangement the present invention can be applied, FIGS. 2a and 2b demonstrate the efficiency of the method A semiconductor sample 1 is coupled to a microwave reflectometer 2 so that microwave reflectometer 2 radiates microwave onto semiconductor sample 1, and the microwave signal reflected from semiconductor sample 1 is sensed by reflectometer 2 in function of time, then the signal is transferred to control signal recording and/or signal processing (further on signal processing) unit 3. Part of semiconductor sample 1 to be measured being in connection with microwave reflectometer 2 is illuminated by laser light source 4, typically in a pulse-like mode. The front side of 1 semiconductor sample being connected to microwave reflectometer 2 and laser light source 4 is coupled to corona discharge generator 5, whereas the back side of the semiconductor sample 1 to acorona discharge generator 6.

During operation, light pulses from laser light source 4 generate excess carriers, electron-hole pairs, as compared to the original equilibrium state in the semiconductor sample 1, which disappear in time, i.e. they recombine.

Microwave radiated onto the semiconductor sample 1 from the microwave reflectometer 2 is reflected, and the detector in the microwave reflectometer 2 generates an electric signal proportional to the reflected microwave power, which signal is recorded by the signal processing unit 3 in function of time. The time constant of the typically exponential curve is the carrier lifetime to be determined.

In a preferred embodiment, the arrangement shown in FIG. 1 consists of a microwave reflectometer 2 of 10.3 GHz microwave frequency measuring the time course of the change in reflection, whereas in semiconductor sample 1 carrier pairs are generated by a GaAs laser of 904 nm wavelength with its spot focused on an about 1 mm² surface of the sample, where the laser light generates carrier pairs in concentrations of about $10^{15}$–$10^{17}$/cm³. Thus the result provides information on the proximity of about the 1 mm² surface illuminated, and if a suitable device provides for moving the semiconductor sample 1, the quality of the full surface of the semiconductor sample 1 can be mapped. Such a device measuring the lifetime of minority carriers based on microwave reflection is e.g. the instrument WT-85 of Semilab Rt., available commercially. The operation of such instruments is well known in the literature for qualifying semiconductors, therefore no further details are given here.

The main characterizing feature of the present invention is that simultaneously with life-time measurement of minority carriers, the front side of the semiconductor sample 1 to be measured is connected to corona charge generator 5, whereas its backside to corona charge generator 6, while semiconductor sample 1 is electrically grounded. During charging, corona charge generators 5 and 6 provide continuously oxygen and nitrogen ions to the measured part of surface of the semiconductor sample 1. If the surface of the semiconductor sample 1 is covered with a badly conducting layer, e.g. the semiconductor has an oxide layer formed under ambient conditions (temperature and pressure) on its surface, then continuous charging with sufficient rate, i.e. charging current, can still ensure an appropriate field strength. This field strength separates the free carriers of opposite charge in proximity of the surface, reducing thereby significantly the rate of recombination. Due to the above effect, surface processes can be eliminated from the measurement of carriers. An advantage of the present invention is that the elimination of surface recombination, i.e. passivation of the surface is achieved without any pretreatment of the semiconductor sample 1, and no significant change (neither in the bulk, nor at the surface) is caused from the viewpoint of typical semiconductor technologies. Another favourable point is that this procedure can be applied for a very broad spectrum of samples (for both thermally oxidised and without oxidation) occurring in practice.

FIGS. 2a and 2b demonstrate the efficiency of the method for an unoxidized silicon segment during its life-time mapping with a resolution of 1 mm. FIG. 2a shows the result of a traditional measurement, i.e. that without simultaneous electric charging. Due to the significant role of surface recombination processes, characteristic values fall in the range of 10–20 µs. During mapping shown in FIG. 2b, simultaneously to lifetime measurement, corona charging of the surface was also performed. It can be seen that due to the elimination of surface recombination, the measured lifetime is significantly longer illustrating the efficiency of passivation.

What is claimed is:

1. A method for passivating a surface of a semiconductor material, comprising:

determining a lifetime of free carriers of the semiconductor material by illuminating the semiconductor material with a light pulse having a higher energy than a forbidden band of the semiconductor material and measuring a time function of a resistance change occurring in the semiconductor material as a result of the illumination with a microwave reflectometer; and continuously electrically charging the semiconductor material simultaneously with said determining step.

2. The method of claim 1, wherein the electrically charging step includes electrically charging the semiconductor material with gas ions generated by corona discharging.

3. The method of claim 1, wherein the electrically charging step includes illuminating the semiconductor material with UV light.

4. The method of claim 1, further comprising the step of playing the semiconductor material on a movable table, and wherein the measuring step is performed as a function of place.

5. The method of claim 2, further comprising the step of playing the semiconductor material on a movable table, and wherein the measuring step is performed as a function of place.

6. The method of claim 3, further comprising the step of playing the semiconductor material on a movable table, and wherein the measuring step is performed as a function of place.

7. An arrangement for passivating a surface of a semiconductor material, comprising:

a microwave reflectometer;

a processing unit coupled to said microwave reflectometer;

a laser light source coupled to said microwave reflectometer for illuminating the semiconductor material with a light pulse having a higher energy than a forbidden band of the semiconductor material, wherein the reflectometer and processing unit measure a time function of a resistance change occurring as a result of the illuminating and determine a lifetime of carriers of the semiconductor material as a characteristic time constant; and at least one corona generator for continuously electrically charging a surface of the semiconductor material with gas ions simultaneously with the measuring the resistance change.

8. An arrangement for passivating a surface of a semiconductor material, comprising:

a microwave reflectometer;

a processing unit coupled to said microwave reflectometer;

a laser light source coupled to said microwave reflectometer for illuminating the semiconductor material with a light pulse having a higher energy than a forbidden band of the semiconductor material, wherein the reflectometer and processing unit measure a time function of a resistance change occurring as a result of the illuminating and determine a lifetime of carriers of the semiconductor material as a characteristic time constant; and at least one source of UV light for illuminating a surface of the semiconductor material with UV light simultaneously with the measuring the resistance change.

* * * * *